United States Patent
Su et al.

(10) Patent No.: US 10,515,953 B2
(45) Date of Patent: Dec. 24, 2019

(54) METHOD AND STRUCTURE FOR GAP FILLING IMPROVEMENT

(71) Applicant: Taiwan Semiconductor Manufacturing Company, Ltd., Hsin-Chu (TW)

(72) Inventors: Ying-Hao Su, Hsinchu (TW); Yu-Chung Su, Hsinchu (TW); Yu-Lun Liu, Changhua County (TW); Chi-Kang Chang, New Taipei (TW); Chia-Chu Liu, Shin-Chu (TW); Kuei-Shun Chen, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/783,448

(22) Filed: Oct. 13, 2017

(65) Prior Publication Data
US 2018/0040617 A1 Feb. 8, 2018

Related U.S. Application Data

(62) Division of application No. 14/163,843, filed on Jan. 24, 2014, now Pat. No. 9,793,268.

(51) Int. Cl.
*H01L 27/088* (2006.01)
*H01L 21/8234* (2006.01)
(Continued)

(52) U.S. Cl.
CPC ...... *H01L 27/0886* (2013.01); *H01L 21/0276* (2013.01); *H01L 21/02118* (2013.01);
(Continued)

(58) Field of Classification Search
CPC .................................. H01L 29/66795
See application file for complete search history.

(56) References Cited

U.S. PATENT DOCUMENTS

| 5,710,076 A | 1/1998 | Dai et al. |
| 6,214,715 B1 | 4/2001 | Huang et al. |
(Continued)

FOREIGN PATENT DOCUMENTS

| CN | 102097361 A | 6/2011 |
| JP | 2007141905 A | 6/2007 |
(Continued)

OTHER PUBLICATIONS

Tian et al., English translation of CN 102097361 A, Jun. 15, 2011.*
(Continued)

*Primary Examiner* — Xia L Cross
(74) *Attorney, Agent, or Firm* — Haynes and Boone, LLP

(57) ABSTRACT

Semiconductor devices having void-free dielectric structures and methods of fabricating same are disclosed herein. An exemplary semiconductor device includes a plurality of fin structures disposed over a substrate having isolation features disposed therein and a plurality of gate structures disposed over the plurality of fin structures. The plurality of gate structures traverse the plurality of fin structures. The semiconductor device further includes a dielectric structure defined between the plurality of fin structures and the plurality of gate structures. The dielectric structure has an aspect ratio of about 5 to about 16. The dielectric structure includes a first dielectric layer disposed over the substrate and a second dielectric layer disposed on the first dielectric layer. The first dielectric layer and the second dielectric layer are disposed on sidewalls of the plurality of fin structures and sidewalls of the plurality of gate structures.

20 Claims, 5 Drawing Sheets

(51) Int. Cl.
  *H01L 21/02* (2006.01)
  *H01L 21/027* (2006.01)
  *H01L 29/66* (2006.01)
  *H01L 21/768* (2006.01)

(52) U.S. Cl.
  CPC .. *H01L 21/02282* (2013.01); *H01L 21/02299* (2013.01); *H01L 21/02318* (2013.01); *H01L 21/76837* (2013.01); *H01L 21/823431* (2013.01); *H01L 21/823437* (2013.01); *H01L 29/66795* (2013.01)

(56) References Cited

U.S. PATENT DOCUMENTS

| | | | |
|---|---|---|---|
| 7,247,198 | B2 | 7/2007 | Fujioka et al. |
| 8,440,517 | B2 | 5/2013 | Lin et al. |
| 8,507,185 | B2 | 8/2013 | Bae et al. |
| 8,709,901 | B1 | 4/2014 | Chang et al. |
| 2003/0197178 | A1 | 10/2003 | Yamazaki et al. |
| 2005/0026443 | A1* | 2/2005 | Goo ............... H01L 21/02164 438/694 |
| 2008/0286689 | A1 | 11/2008 | Zhuang et al. |
| 2009/0071697 | A1 | 3/2009 | Ishikawa et al. |
| 2010/0133614 | A1 | 6/2010 | Beyer et al. |
| 2011/0104437 | A1 | 5/2011 | Yamamura et al. |
| 2011/0127610 | A1* | 6/2011 | Lee ............... H01L 21/823431 257/365 |
| 2011/0193178 | A1 | 8/2011 | Chang et al. |
| 2012/0032267 | A1* | 2/2012 | Cheng ............... H01L 21/31111 257/368 |
| 2012/0187574 | A1* | 7/2012 | Sasaki ............... H01L 25/18 257/777 |
| 2013/0014980 | A1 | 1/2013 | Takeda et al. |
| 2013/0285143 | A1* | 10/2013 | Oh ............... H01L 21/823821 257/347 |
| 2013/0288471 | A1* | 10/2013 | Chi ............... H01L 29/665 438/586 |
| 2014/0001562 | A1 | 1/2014 | Liaw |
| 2014/0124873 | A1* | 5/2014 | Jagannathan ........... H01L 29/49 257/407 |
| 2014/0227858 | A1 | 8/2014 | Shen et al. |
| 2014/0353795 | A1 | 12/2014 | Tong et al. |

FOREIGN PATENT DOCUMENTS

| | | |
|---|---|---|
| JP | 2012039002 | 2/2012 |
| TW | 201030111 A | 8/2010 |
| TW | 201033742 A | 9/2010 |
| TW | 201216467 A | 4/2012 |
| TW | 201338163 A | 9/2013 |

OTHER PUBLICATIONS

Taiwan Patent Office; Taiwan Application No. 103145702, Office Action dated Apr. 18, 2016, 11 pages.
Tian et al., English Translation of CN 102097361A, Jun. 2011.

* cited by examiner

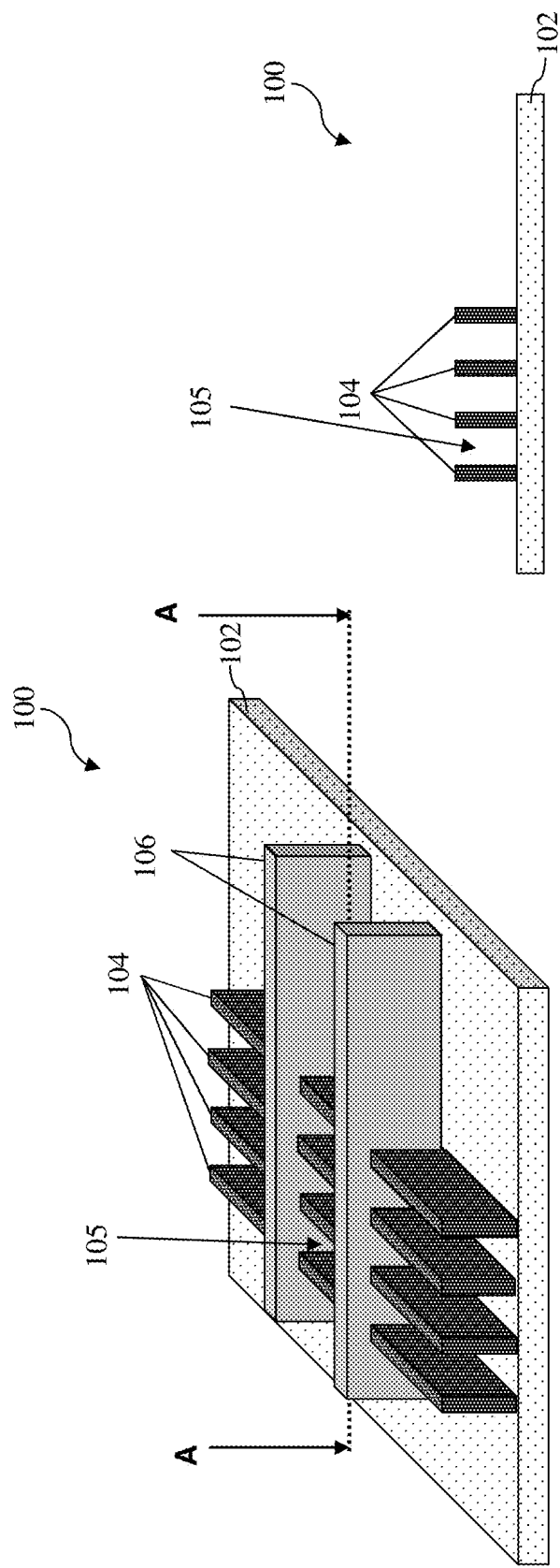

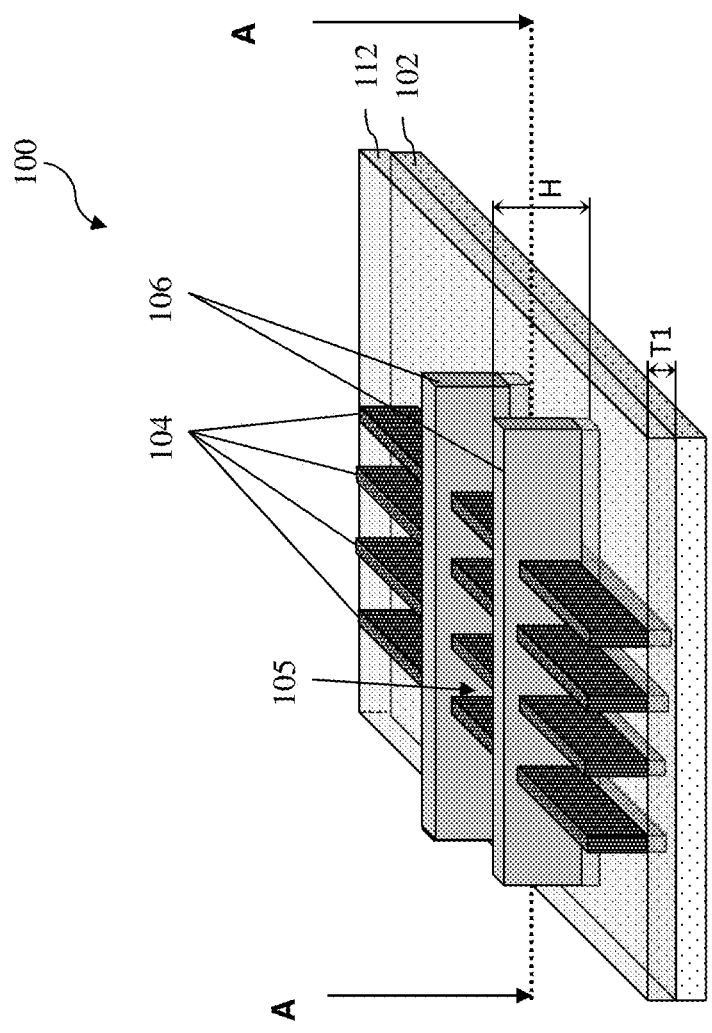
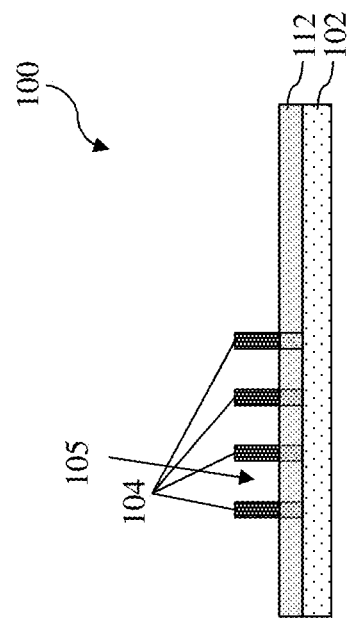
FIG. 2A
FIG. 2B

METHOD AND STRUCTURE FOR GAP FILLING IMPROVEMENT

This is a divisional patent application of U.S. patent application Ser. No. 14/163,843, filed Jan. 24, 2014, now U.S. Pat. No. 9,793,268 which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

As the critical dimension (CD) of a feature is scaled down, the feature may have a high aspect ratio (the ratio of the height Vs. width of the feature). Such scaling down has also increased the complexity of structure and processing of ICs and, for these advances to be realized, similar developments in IC processing and manufacturing are needed. For example, a three dimensional (3D) transistor, has been introduced to replace a planar transistor. Although existing structures and methods of fabricating semiconductor devices have been generally adequate for their intended purposes, they have not been entirely satisfactory in all respects. For example, to introduce three dimensional semiconductor structure including features with high aspect ratio raises challenges in a semiconductor device process development. Accordingly, it is desired to have improvements in this area.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIGS. 1A, 2A, and 3A are schematic drawings illustrating a semiconductor structure at various fabrication steps for an improved gap filling process, in accordance with some embodiments.

FIGS. 1B, 2B, and 3B are cross-sectional views of the semiconductor structure along the line A-A of FIGS. 1A, 2A, and 3A respectively at various fabrication steps for an improved gap filling process, in accordance with some embodiments.

DETAILED DESCRIPTION

Figures 3A, 3B:
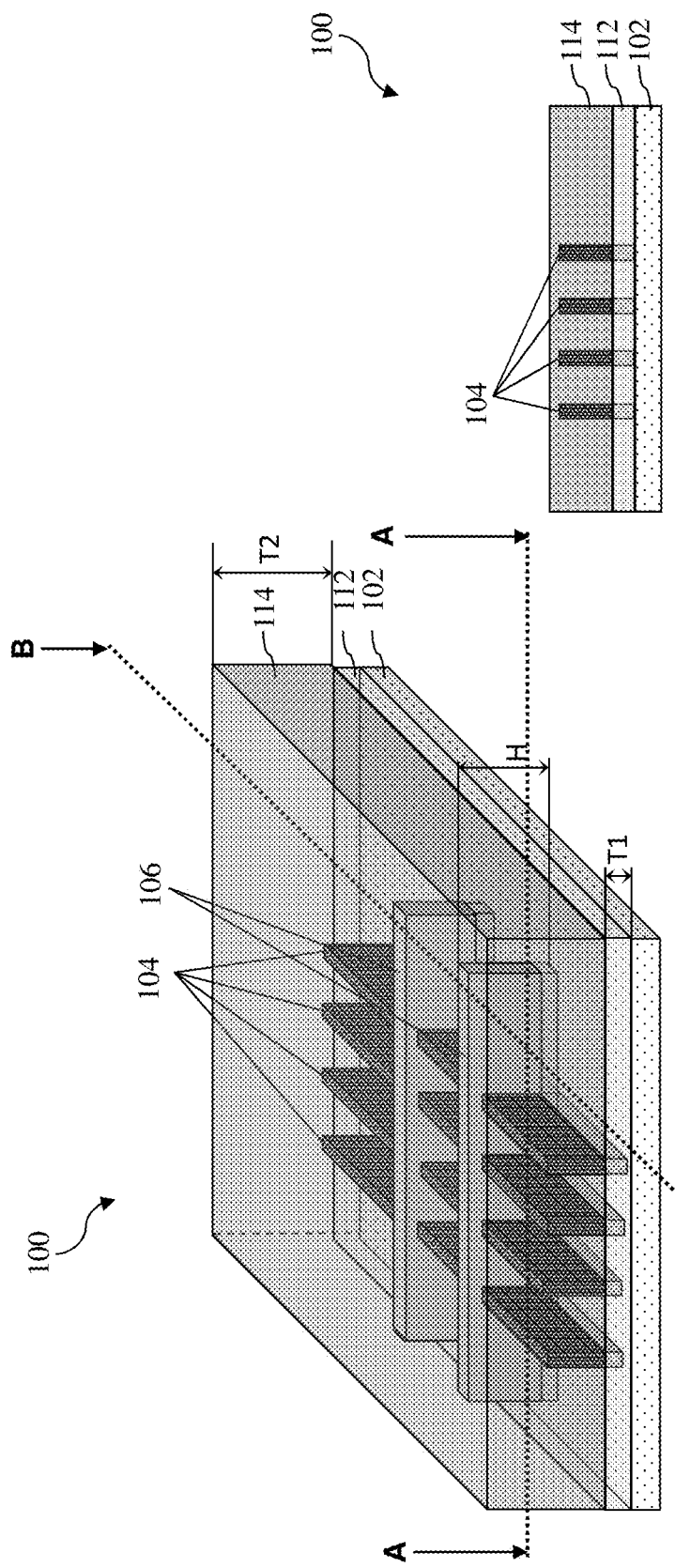

The following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIGS. 1A, 2A and 3A are schematic drawings illustrating a semiconductor structure 100 at various fabrication steps, and FIGS. 1B, 2B, and 3B are cross-sectional views of semiconductor structure 100 along the line A-A of FIGS. 1A, 2A and 3A respectively at various fabrication steps. The semiconductor structure 100 may include an n-type finFET or a p-type finFET. The semiconductor structure 100 may be included in an integrated circuit (IC) such as a microprocessor, a memory device, and/or other IC devices.

Referring to FIGS. 1A-1B, the semiconductor structure 100 includes a substrate 102 and semiconductor features, such as fins 104 and gate structures 106, formed on the substrate 102. Gaps (e.g., gap 105) are formed between two adjacent semiconductor features. In some embodiments, the substrate 102 is a silicon substrate. In some alternative embodiments, the substrate 102 includes other elementary semiconductor, such as germanium (Ge); a compound semiconductor including silicon carbide (SiC), gallium arsenic (GaAs), gallium phosphide (GaP), indium phosphide (InP), indium arsenide (InAs), and/or indium antimonide (InSb); an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP) or combinations thereof.

Still referring to FIGS. 1A-1B, in some embodiments, the substrate 102 further includes additional features and/or material layers, such as various isolation features. The isolation features may be formed of silicon oxide, silicon nitride, silicon oxynitride, fluoride-doped silicate glass (FSG), a low-k dielectric material, and/or other suitable insulating materials. The isolation features may be shallow trench isolation (STI) features. In some embodiments, the isolation features are STI features and are formed by etching trenches in the substrate 102. The trenches may then be filled with isolating material, followed by a chemical mechanical polish (CMP) process. Other fabrication techniques for the isolation features are possible. The isolation structures may include a multi-layer structure, for example, having one or more liner layers. The substrate 102 may also include various doped regions, such as p-type doped regions and/or n-type doped regions configured and coupled to form various devices and functional features. All doping features may be achieved using a suitable process, such as ion implantation in various steps and techniques.

Referring to FIG. 1A, the fins 104 may include silicon or another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The fins 104 may be fabricated using any suitable processes including photolithography and etch processes. The photolithography process may include forming a photoresist (resist) layer overlying the substrate, exposing the resist to a radiation source to using a mask, performing post-exposure bake processes, and developing the resist to form the resist patterns. The resist patterns may then be used to protect regions of the substrate while an etch process forms a recesses into the silicon layer, leaving an extending fin. The recesses may be etched using reactive ion etch (RIE) and/or other suitable processes. Numerous other embodiments of methods to form the fins 104 on the substrate 102 may be suitable. It is also to be understood that the fins 104 shown in FIGS. 1A-1B, 2A-2B, and 3A-3B are merely examples, and are not intended to be limiting on the shapes and/or sizes of the fin structures in the semiconductor structure 100.

Still referring to FIG. 1A, in some embodiments, the gate structures 106 are poly gates that are to be replaced in a following replacement poly gate process (RPG) to form, for example, metal gate structures or high-k gate structures. In some embodiments, the gate structures 106 include polysilicon.

In some embodiments, the height of the fins 104 may be in a range from about 200 Å to about 500 Å. The height of the gate structures 106 may be in a range from about 900 Å to about 1300 Å. In some embodiments, the width of the gaps (e.g., gap 105) between fins 104 and/or gate structures 106 may be in a range from about 80 Å to about 190 Å. Therefore, the aspect ratio of the gaps may be in a range from about 5 to about 23. In some preferable embodiments, the aspect ratio of the gaps is in a range from about 5 to about 16. As the critical dimension (CD) of the semiconductor features, such as fins 104 and gate structures 106, scales down, the aspect ratio of the semiconductor features may increase.

In some embodiments, when one or more material layers (e.g., dielectric layers) are formed using coating techniques, the coating solution may not completely fill in the gaps (e.g., gap 105) due to the increased aspect ratio. Voids, such as air bubbles, may be trapped as the material layers fill in the gaps with high aspect ratio. In some embodiments, when the aspect ratio of the gaps is greater than about 8, or the width of the gaps is less than about 150 Å, voids can be observed in the material layers. The voids trapped in the material layer may affect the etching processes, trap contaminants, and deteriorate the device performance. Therefore, it is desirable to have a method to provide improved gap filling.

Before forming the first dielectric layer, in some embodiments, the surface of the substrate 102 is treated to improve the surface affinity between the substrate 102 and a material layer to be formed on the substrate, such as a first dielectric layer 112 as discussed later with respect to FIGS. 2A-2B. In some embodiments, the surface of the substrate 102 is treated with cleaning, dehydrating and/or surface priming processes, so that the surface of the substrate 102 has a good adhesion between the substrate 102 and the first dielectric layer 112 to be formed on the substrate 102. In some examples, the cleaning process may include wet cleaning and/or DI water rinsing to remove contaminants. In some embodiments, the dehydrating process may be done in a closed chamber to remove adsorbed water on the surface of the substrate 102. In some embodiments, polymers with suitable adhesion functional groups may be applied to treat the surface of the substrate 102 in a surface priming process. In some embodiments, the functional groups include hydrophilic groups or hydrophobic groups depending on the hydrophilic/hydrophobic property of the material layer to be formed on the substrate, such as the first dielectric layer 112.

Referring to FIGS. 2A-2B, a first dielectric layer 112 is formed on the substrate 102. In some embodiments, the first dielectric layer 112 is formed using a coating solution with a controlled viscosity to facilitate the process of filing the gaps (e.g., gap 105) and the uneven surface profiles between the semiconductor features (e.g., fins 104 and/or gates 106). In some embodiments as discussed in details later in the present disclosure, the viscosity of the coating solution can be controlled by tuning the concentration of the solutes in the coating solution and/or by adding surfactants into the coating solution. The filling process can also be facilitated by applying a reflow process and/or performing a surface treatment to the substrate. The first dielectric layer 112 provides a planar surface over the substrate. In addition, the dielectric material in the first dielectric layer 112 may provide a suitable etching selectivity for etching in the one or more following patterning processes.

In some embodiments, the first dielectric layer 112 is formed using a coating technique. A first coating solution is used in the coating technique to form the first dielectric layer 112. In some embodiments, the solute of the first coating solution includes at least one of acrylate, methacrylate, polyhydroxystyrene, or other polymers including crosslinking functional groups. In some embodiments, the solvent used in the first coating solution includes at least one of propylene glycol monomethyl ether (PGME), propylene glycol monomethyl ether acetate (PGMEA), ethyl lactate (EL), cyclohexanone, or any other suitable solvent materials. In some embodiments, a first viscosity of the first coating solution is in a range from about 1 centipoise (cP) to about 1.5 cP. In some embodiments, the first viscosity of the first coating solution is controlled by adjusting the concentration of the solute dissolved in the solvent. For example, the concentration of the solute in the first coating solution may be controlled to be in a range from about 0.1% to about 10%.

In some embodiments, the first viscosity may also be adjusted by adding suitable additive materials into the first coating solution, such as materials with crosslinking groups. For example, the additive materials may include at least one of tetrabutylammonium hydroxide (TBAH), or tetrabutylammonium lactate. The amount of the additive materials being added into the first coating solution may be controlled to be in a range from about 0.5% to about 98%.

In some embodiments, the solvent of the first coating solution is also adjusted to improve affinity between the first dielectric layer 112 and the substrate 102. The first coating solution may be adjusted to reduce the surface tension and improve the affinity between the first dielectric layer 112 and the fins 104 and/or gate structures 106. For example, Hansen solubility parameters may be used to evaluate the affinity between different layers.

In some embodiments, surfactants may be added to the first coating solution in a range from about 0.01% to about 1% to reduce the surface tension between the first material layer 112 and the substrate 102. In some embodiments, the surfactants includes one or more materials selected from the group consisting of ammonium lauryl sulphate (ALS), octyl- and nonylphenol ethoxylates, alcohol (primary and secondary) ethoxylates, amine ethoxylates, glucosides, glucamine, polyethylene glycols, poly(ethylene glycol-co-propylene glycol), and combinations thereof. In some examples, the surfactants may include Triton® X surfactants and TERGITOL™ TMN-6 (The Dow Chemical Company, USA).

The first coating solution is then coated on the substrate 102 to form the first dielectric layer 112. In some examples, the coating process may include a spin coating process with a spin rate in a range from about 500 rpm to about 2500 rpm. During the spinning process, the solvent may be partially or fully evaporated. In some embodiments, the spin coating process may include a spin-on dielectric process. In some embodiments, the coating process may include other types of coating methods, such as a dip coating method.

After the coating the first coating solution, a baking process is conducted to evaporate the solvent in the coated film layer. In some embodiments, the baking process is performed at a temperature in a range from about 80° C. to about 300° C. In some embodiments, the baking process is performed for a period of time in a range from about 5 seconds to 3 minutes.

In some embodiments, the first dielectric layer 112 includes one or more organic dielectric materials such as acrylate, methacrylate, polyhydroxystyrene, or other polymers including crosslinking functional groups, and combinations thereof. In some embodiments, the first dielectric layer 112 is used as an anti-reflective coating (ARC) layer configured to suppress unintended light reflection during lithography process as discussed later. In some embodiments, the ARC layer has a reflective index in a range from about 1 to about 2.2. In some embodiments, the first dielectric layer 112 is used as a mask during the following etching processes. For example, prior to recessing the source/drain regions of the n-type region, the first dielectric layer 112 is used to cover the p-type region to protect the p-type region from being etched; or prior to recessing the source/drain regions of the p-type region, the first dielectric layer 112 is used to cover the n-type region to protect the n-type region from being etched. Alternatively, the first dielectric layer 112 may be used as an etch stop layer for the following one or more etching processes, such as a contact etching process. In some embodiments, the first dielectric layer 112 is removed after the etching processes.

In some embodiments, the first dielectric layer 112 includes one or more inorganic dielectric materials, such as silicon nitrides, silicon silicates and/or silicon oxides. In some embodiments, the first dielectric layer 112 can be included in one or more interlayer dielectric (ILD) layers. In some embodiments, the first dielectric layer 112 can also include a hard mask layer that is used for patterning in the following processes.

Still referring to FIGS. 2A-2B, in some embodiments, although the first dielectric layer 112 fills the gaps between the semiconductor features, the first dielectric layer 112 may not be formed to fully cover the semiconductor features (e.g., the fins 104 and the gate structures 106). In some examples as shown in FIG. 2A, the height (H) of the semiconductor features (e.g., the height of the gate structures 106) is greater than the thickness (T1) of the first material layer 112. In some embodiments, the first dielectric layer 112 has a thickness (T1) in a range from about 100 Å to about 6000 Å. In some preferable embodiments, the thickness (T1) is in a range from about 100 Å to about 800 Å. As illustrated in FIGS. 2A-2B, after forming the first dielectric layer 112, the aspect ratio of the gaps, e.g., gap 105, can be reduced, so that the subsequent gap filling processes can be facilitated.

After forming the first dielectric layer 112, in some embodiments, a thermal reflow process is performed to the first dielectric layer 112 to increase the fluidity of the first dielectric layer 112, so that the gap filling in the semiconductor features (e.g., fins 104 and/or gate structures 106) may be improved. In some embodiments, the thermal reflow process includes heating the first dielectric layer 112 at a temperature in a range from about 150° C. to about 300° C. In some embodiments, the thermal reflow process is performed for a period of time in a range from about 5 seconds to about 10 minutes. During the thermal reflow process, the material in the first dielectric layer 112 may become mobile to fill in the gaps (e.g., gap 105) between the semiconductor features on the substrate 102.

Referring to FIGS. 3A-3B, a second dielectric layer 114 is formed on the first dielectric layer 112. In some embodiments, the second dielectric layer 114 is formed to fill in the gaps and to cover the semiconductor features including fins 104 and gate structures 106.

In some embodiments, the second dielectric layer 114 is formed using a coating method. A second coating solution is used to form the second dielectric layer 114. In some embodiments, the second coating solution may include substantially similar materials as the materials used in the first coating solution. In some embodiments, the solute of the second coating solution includes at least one of acrylate, methacrylate, polyhydroxystyrene, or other polymers including crosslinking functional groups. The solvent of the second coating solution includes at least one of propylene glycol monomethyl ether (PGME), propylene glycol monomethyl ether acetate (PGMEA), ethyl lactate (EL), cyclohexanone, or any other suitable solvent materials. In some alternative embodiments, the second coating solution may include materials or solvent different from that of the first coating solution. In some embodiments, the second coating solution has a second viscosity that is different from the first viscosity. In some embodiments, the second viscosity is greater than the first viscosity. The second viscosity may be in a range from about 1.8 cP to about 2 cP. The greater viscosity of the second coating solution can improve the efficiency of forming the second dielectric layer 114, so that it takes less time and less solvent to form the second dielectric layer 114. In some embodiments, the viscosity is tuned by controlling the concentration of the solute in the second coating solution. The concentration of the solute in the second coating solution may be controlled to be at least about 10% higher than the concentration of the first coating solution.

In some embodiments, the viscosity may also be adjusted by adding suitable additive materials, such as materials with crosslinking groups, into the second solution to change the properties and compositions of the solution. For example, the additive materials may include at least one of tetrabutylammonium hydroxide (TBAH), or tetrabutylammonium lactate. The amount of the additive materials being added into the first and/or second coating solutions may be controlled to be in a range from about 0.5% to about 98%. In some embodiments, the amount of the additive materials being added into the second coating solution is at least about 10% greater than the amount of additive materials being added into the first coating solution.

In some embodiments, the second coating solution may also be adjusted to reduce the surface tension and improve the affinity between the second dielectric layer 114 and the fins 104 and/or gate structures 106. For example, Hansen solubility parameters may be used to evaluate the affinity between different layers. In some embodiments, surfactants may also be added to the second coating solution. The surfactant materials are substantially similar to that used in the first dielectric layer 112.

In some embodiments, the second dielectric layer 114 is coated onto the first dielectric layer 112. In some embodiments, the coating process of the second coating solution may be substantially similar to the coating process of the first coating solution. In some embodiments, the coating process of the second coating solution includes a spin coating process with a spin rate less than that of the coating process of the first coating solution. In some embodiments, because the viscosity of the second solution is greater than the viscosity of the first solution, the thicknesses of the first material layer and the second material layer may be dominated by the viscosities of the first coating solution and the second coating solution respectively. In some embodiments, the coating process may include other types of coating methods, such as a dip coating method. In some embodiments, the coating process may include other types of coating methods, such as a dip coating method.

After the coating the first coating solution, a baking process is conducted to evaporate the solvent in the coated film layer. In some embodiments, the baking process is performed at a temperature in a range from about 80° C. to about 300° C. In some embodiments, the baking process is performed for a period of time in a range from about 5 seconds to 3 minutes.

In some embodiments, the second dielectric layer 114 includes substantially similar materials as discussed with respect to the first dielectric layer 112. In some embodiments, the second dielectric layer 114 includes an organic dielectric material, such as acrylate, methacrylate, polyhydroxystyrene, or other polymers including crosslinking functional groups, and combinations thereof. The second dielectric layer 114 may function as an anti-reflective (ARC) material configured to suppress unintended light reflection during the following lithography process. The ARC layer may have a reflective index in a range from about 1 to about 2.2. The second dielectric layer 114 may be used as masks during the following etching processes. In some examples, prior to recessing the source/drain regions of the n-type region, the second dielectric layer 114 may be used to cover the p-type region to protect the p-type region from being etched; or prior to recessing the source/drain regions of the p-type region, the second dielectric layer 114 may be used to cover the n-type region to protect the n-type region from being etched. Alternatively, the second dielectric layer 114 may be used as an etch stop layer for the following one or more etching processes, such as a contact etching process. The second dielectric layer 114 is removed after the etching processes.

In some embodiments, the second dielectric layer 114 includes one or more inorganic dielectric materials, such as silicon nitrides, silicon silicates and/or silicon oxides. In some embodiments, the second dielectric layer 114 can be included in the one or more interlayer dielectric (ILD) layers. In some embodiments, the second dielectric layer 114 may also include a hard mask layer that is used for patterning in the following processes.

In some embodiments, the thickness (T1) of the first dielectric layer 112 plus the thickness (T2) of the second dielectric layer 114 is greater than the height (H) of the semiconductor features. In some embodiments, the second dielectric layer 114 has a thickness (T2) in a range from about 100 Å to about 6000 Å. In some preferable embodiments, the thickness (T2) is in a range from about 100 Å to about 2000 Å. The second dielectric layer 114 is configured to provide a planar surface and to provide a suitable etching selectivity for etching in the following one or more patterning processes.

Figure 4:
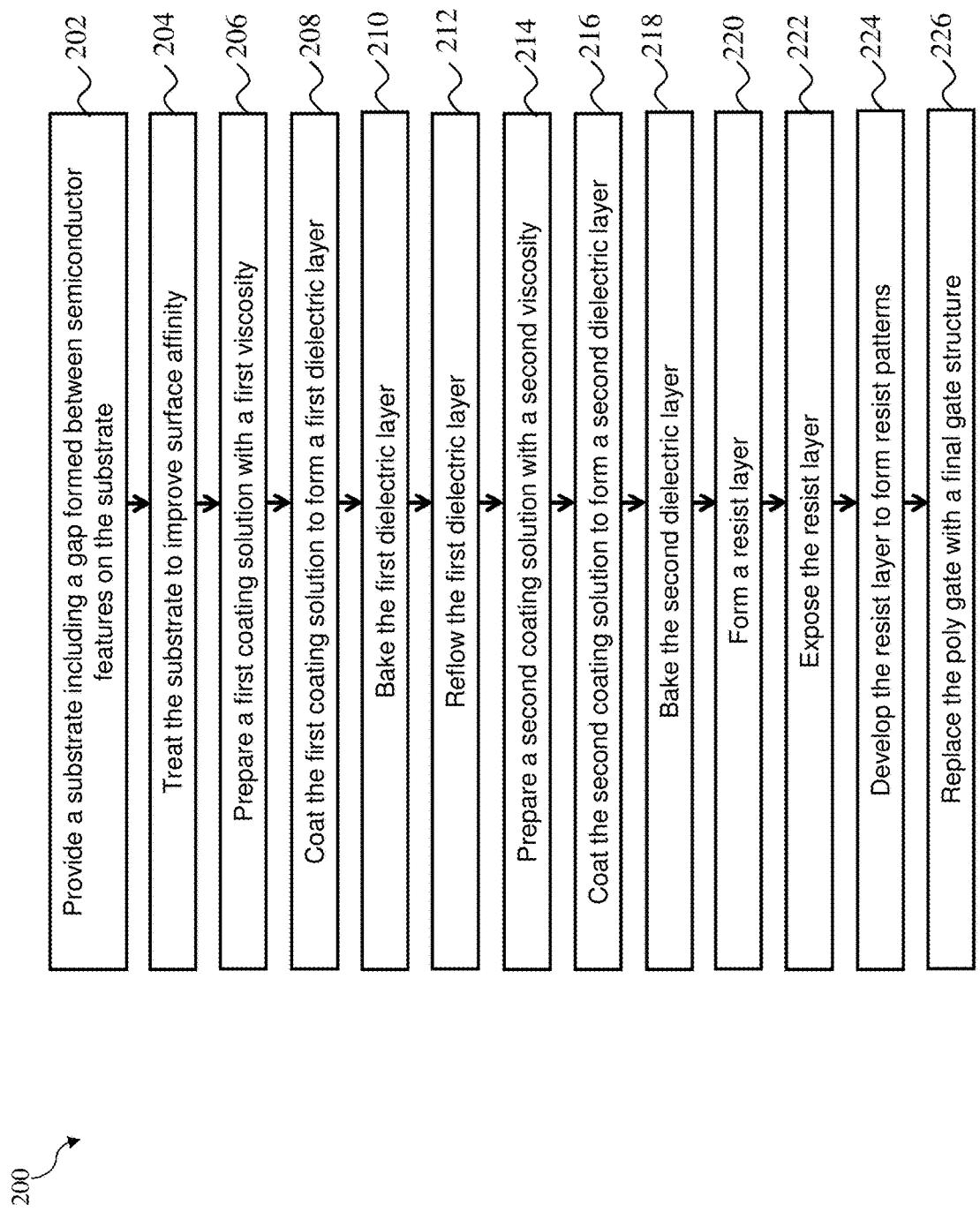
FIG. 4 is a flow chart illustrating a method to improve the gap filling process, in accordance with some embodiments.

FIG. 4 is a flow chart illustrating a method 200 of forming semiconductor structure 100 to improve the gap filling process according to some embodiments of the present disclosure. Method 200 starts from step 202 by providing the substrate 102 including semiconductor features such as fins 104 and gate structures 106. Gaps (e.g., gap 105) are formed between the fins 104 and/or gate structures 106, as shown in FIGS. 1A-1B.

Method 200 proceeds to an optional step 204 by treating the surface of the substrate 102 to improve the surface affinity between the substrate 102 and a material layer to be formed on the substrate, such as a first dielectric layer 112 as discussed later with respect to step 206. The details of the surface treatment at step 204 are discussed earlier in the present disclosure with reference to FIGS. 1A-1B. In some embodiments, step 202 of the method 200 may directly proceed to step 206 without performing step 204.

Method 200 proceeds to step 206 by preparing a first coating solution that is used to form the first dielectric layer 112. The solute and solvent used to form the first coating solution have been discussed earlier with respect to FIGS. 2A-2B in the present disclosure.

Method 200 proceeds to step 208 by coating the first coating solution on the substrate 102 to form a first dielectric layer 112. In some examples, the coating process may include a spin coating process or any other suitable coating methods, such as a dip coating method.

Method 200 proceeds to step 210 by baking the coated first dielectric layer 112. The baking process is conducted to evaporate the solvent in the first dielectric layer 112.

Still referring to FIG. 4, method 200 proceeds to an optional step 212 by reflowing the first dielectric layer 112. In some embodiments, the thermal reflow process may be performed to the first dielectric layer 112 to increase the fluidity of the first dielectric layer 112, so that the gap filling in the semiconductor features (e.g., fins 104 and/or gate structures 106) may be improved. In some embodiments at step 212, the thermal reflow process is performed after baking the coated first dielectric layer 112 at step 210 to further evaporate the solvent. In some alternative embodiments, the thermal reflow process is performed after coating the first coating solution at step 208, without baking the coated layer. In some embodiments with respect to method 200, step 210 may directly proceed to step 214 without reflowing the first dielectric layer 112 at step 212.

Method 200 proceeds to step 214 by preparing a second coating solution that is used to form the second dielectric layer 114. The solute and solvent used to form the second coating solution have been discussed earlier with respect to FIGS. 3A-3B in the present disclosure.

Method 200 proceeds to step 216 by coating the second coating solution on the first dielectric layer 112 to form the second dielectric layer 114. In some examples, the coating process may include a spin coating process. The spin coating process may include a spin-on dielectric process. In some embodiments, the coating process may include other types of coating methods, such as a dip coating method.

After the coating process, method 200 proceeds to step 218 by baking the second dielectric layer 114 to evaporate the solvent in the second dielectric layer 114.

Although the formation of the first dielectric layer 112 and the second dielectric layer 114 are illustrated with respect to the flow charts of FIG. 4, the first dielectric layer 112 and the second dielectric layer 114 may be formed using any suitable combination(s) of various steps to improve the gap fillings in the semiconductor structure 100. In some embodiments, a planarization process (e.g., a CMP process) is performed after forming the first and the second dielectric layers. In some embodiments, because the first dielectric layer 112 and the second dielectric layer 114 discussed in the present disclosure can provide planar surfaces, no planarization process (e.g., a CMP process) is needed.

Still referring to FIG. 4, after forming the first dielectric layer 112 and the second dielectric layer 114, the method 200 proceeds to step 220 by forming a resist layer on the second dielectric layer 114 for the following lithography processes. In some embodiments, the resist layer is a photoresist layer. In some embodiments, the resist layer is an electron beam sensitive layer. The electron beam sensitive material is patterned by an electron beam lithography process. In some embodiments, the resist layer may be formed using a spin coating technique. The resist layer may have a thickness in a range from about 5 nm to about 1000 nm. Step 220 of method 200 may also include baking the resist layer to evaporate the solvent in the resist layer. In some embodiments, the baking temperature may be in a range from about 30° C. to about 300° C., and the baking time may be in a range from about 5 seconds to about 3 minutes.

Method 200 proceeds to step 222 by exposing the resist layer to a radiation beam. The radiation beam may include ultraviolet (UV), deep ultraviolet (DUV) and/or extreme ultraviolet (EUV), such as a 248 nm beam from a Krypton Fluoride (KrF) excimer laser, or a 193 nm beam from an Argon Fluoride (ArF) excimer laser. In some embodiments, the exposing process at step 214 is performed using a reticle having a predefined pattern (or a reversed pattern). The lithography process may utilize other exposing modes or technologies, such as on-axis, off-axis, quadrupole, or dipole exposure technologies. In some alternative embodiments, the exposing process at step 214 may also be implemented or replaced by other proper methods, such as a maskless lithography technique and electron beam lithography.

Method 200 proceeds to step 224 by developing the resist layer using a developer chemical to form resist patterns. In some examples, the developer chemical includes tetramethyl ammonium hydroxide (TMAH) solution with a proper concentration in a range from about 2% to about 5%. In a preferable embodiment, the concentration of the TMAH solution is in a range from about 2% to about 3%. The method 200 may then proceed to rinsing, drying, and/or other suitable processes. The resist patterns may be used as a masking element in performing one or more processes on underlying layers, such as etching, ion implantation, and/or other suitable processes. The resist patterns may then be etched off during the following processes of the fabrication of the semiconductor device. In some embodiments, the resist patterns may be subsequently stripped from the substrate.

In some embodiments, the resist layer is patterned to be used as an etching mask for the following gate replacement process. In some embodiments, at step 226 of method 200, the poly gate 106 is removed to form a gate trench (e.g., gate trench 500) defined in the first dielectric layer 112 and the second dielectric layer 114. In some embodiments, the removal of the poly gate 106 may include a planarization process used to remove a portion of the second dielectric layer 114 and to expose a top surface of the poly gate 106. In some embodiments, the planarization process may include a chemical mechanical planarization (CMP) process. Upon exposure, the poly gate 106 may be removed in whole or in part by suitable wet and/or dry etching processes.

In some embodiments, after forming the gate trenches, a plurality of spacers 501 are exposed on sidewalls of the gate trenches (e.g., gate trench 500). In some embodiments, the spacers 501 are formed prior to or after the formation of the source/drain regions and along the poly gate 106. In some embodiments, the spacers 501 are formed using a deposition process and an etching process (e.g., an anisotropic etching process). In some embodiments, the spacers 501 include a suitable dielectric material such as silicon nitride, silicon oxide, silicon carbide, silicon oxynitride, or combinations thereof. In some embodiments, a contact etch stop layer (CESL) 503 is also formed on the spacer 501 and on the substrate 102. In some embodiments, the CESL 503 includes silicon nitride, silicon oxide, silicon oxynitride, and/or other suitable materials. In some embodiments, the CESL 503 is formed by a native oxide growth process. In some embodiments, the CESL 503 can also be formed using a chemical vapor deposition (CVD) process and/or other suitable deposition process.

Figure 5:
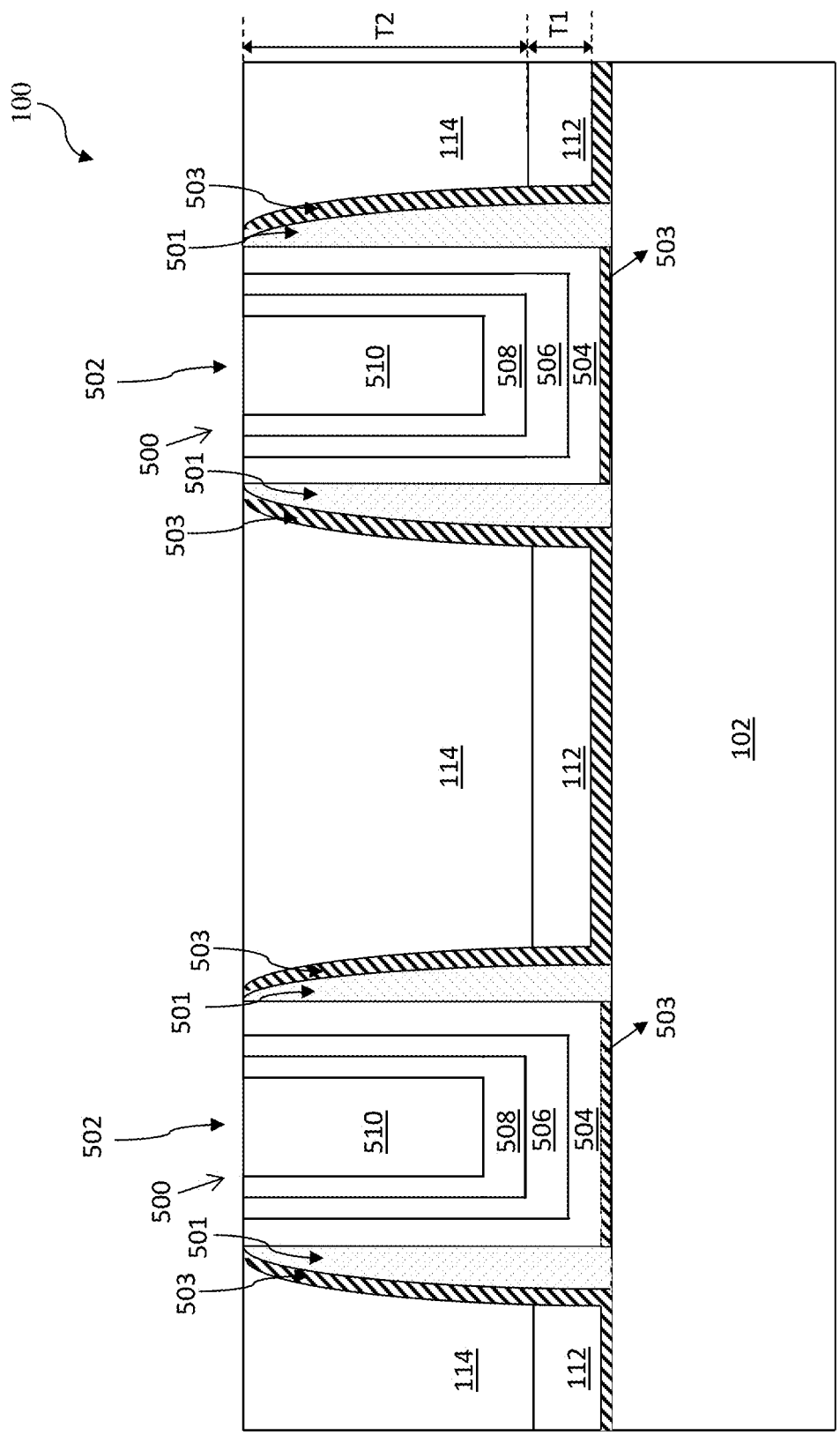
FIG. 5 is a cross-sectional view of the semiconductor structure along line B-B of FIG. 3A after performing a gate replacement process and forming the gate structure, in accordance with some embodiments.

FIG. 5 is a cross-sectional view of the semiconductor structure 100 along line B-B of FIG. 3A after performing a gate replacement process to form a gate structure 502. After removing the poly gate 106, a gate structure 502 is formed to fill the gate trench 500. In some embodiments, the gate structure 502 includes one or more layers, such as a high-k dielectric layer 504, a barrier layer 506, a work function layer 508, and a gate layer 510. However, other embodiments including additional layers and/or fewer layers may be possible. For example, the gate structure may further include capping layer(s), etch stop layer(s), and/or other suitable layers. In some embodiments, a CMP process is performed to provide a planar surface of the final gate structure. The semiconductor structure 100 also includes the first dielectric layer 112 disposed on the substrate 102, and the second dielectric layer 114 disposed on the first dielectric layer 112. The materials, fabrication processes, and layer thicknesses of the first dielectric layer 112 and the second dielectric layer 114 are discussed in details earlier in the present disclosure. In some embodiments, the first dielectric layer 112 has a thickness (T1) in a range from about 100 Å to about 6000 Å. In some preferable embodiments, the thickness (T1) is in a range from about 100 Å to about 800 Å. In some embodiments, the second dielectric layer 114 has a thickness (T2) in a range from about 100 Å to about 6000 Å. In some preferable embodiments, the thickness (T2) is in a range from about 100 Å to about 2000 Å.

In some embodiments, the high-k dielectric layer 504 is formed by chemical oxidation, thermal oxidation, atomic layer deposition (ALD) process, CVD, and/or other suitable formation process. In some embodiments, the high-k dielectric layer 504 includes a high-k dielectric layer such as hafnium oxide ($HfO_2$). Alternatively, the high-k dielectric layer 504 may optionally include other high-k dielectrics, such as $TiO_2$, $HfZrO$, $Ta_2O_3$, $HfSiO_4$, $ZrO_2$, $ZrSiO_2$, combinations thereof, or other suitable material. In some embodiments, the barrier layer 506 may include TaN or any other suitable material.

The work function layer 508 can be an n-type or a p-type work function layer. Exemplary p-type work function metals that may be included in the gate structures 502 include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals that may be included in the gate structures 502 include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the first work function layer is chosen to tune its work function value so that a desired threshold voltage Vt is achieved in the device that is to be formed in the respective region. The work function layer may include a plurality of layers. The work function layer(s) may be deposited by CVD, PVD, and/or other suitable process.

The gate layer 510 may include Al, W, or Cu and/or other suitable materials. The gate layer 510 may be formed by CVD, PVD, plating, and/or other suitable processes. The gate layer 510 may be deposited over the work function metal layer 508, and thereby filling in the remaining portion of the gate trenches. The semiconductor device 100 may also include other layers and/or other features that are not specifically illustrated, such as additional source/drain regions, contacts, interconnects, and/or other suitable features.

The present embodiments describe one or more cost efficient and manufacturable mechanisms for improving gap filling in the semiconductor features with high aspect ratio. The mechanisms involve forming a first dielectric layer using a first solution having a first viscosity, and forming a second dielectric layer using a second solution having a second viscosity that is greater than the first viscosity. The mechanisms also involve reflowing the first dielectric layer. The mechanisms also involve treating the substrate to improve the surface affinity between the substrate and the first dielectric layer. The mechanisms effectively avoid the generation of the voids during the gap filling process. The mechanisms also enable providing suitable etching selectivity for the etching processes in the one or more following patterning processes. The process condition is flexible, and the disclosed mechanisms may apply to various types of layers within a semiconductor structure. The disclosed mechanisms may further be combined with other chemicals or other processes to form various patterns on the substrate.

The present disclosure provides a method for forming a semiconductor structure. The method includes providing a substrate including a plurality of fin structures on the substrate; coating a first solution on the substrate to form a first dielectric layer; and coating a second solution on the first dielectric layer to form a second dielectric layer to cover the fin structures. The first solution has a first viscosity. The second solution has a second viscosity. In some embodiments, the second viscosity is greater than the first viscosity.

The present disclosure also provides a semiconductor structure. The semiconductor structure includes a plurality of fin structures disposed on a substrate, a first dielectric layer disposed on the substrate, and a second dielectric layer disposed on the first dielectric layer. A trench is defined in the first dielectric layer and the second dielectric layer and a gate structure including one or more material layers disposed in the trench. In some embodiments, the first dielectric layer has a first thickness in a range from about 100 Å to about 800 Å, and the second dielectric layer has a second thickness in a range from about 100 Å to about 2000 Å.

The present disclosure also provides a method for filling a gap between semiconductor features on a semiconductor substrate. The method includes forming a first material layer on the semiconductor substrate; reflowing the first material layer at a temperature in a range from about 150° C. to about 300° C.; and forming a second material layer on the first material layer. In some embodiments, the gap between the semiconductor features has an aspect ratio in a range from about 5 to about 16. In some embodiments, a height of the semiconductor features is greater than a thickness of the first material layer. In some embodiments, a sum of the thickness of the first material layer and a thickness of the second material layer is greater than the height of the semiconductor features.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device comprising:
   a substrate;
   at least one isolation feature disposed in the substrate;
   a first fin structure and a second fin structure disposed over the substrate;
   a first gate structure and a second gate structure disposed over the first fin structure and the second fin structure, such that the first gate structure and the second gate structure traverse the first fin structure and the second fin structure;
   an interlayer dielectric structure disposed over the substrate and the at least one isolation feature disposed in the substrate, wherein the interlayer dielectric structure is disposed between sidewalls of the first fin structure, sidewalls of the second fin structure, sidewalls of the first gate structure, and sidewalls of the second gate structure, wherein the interlayer dielectric structure includes:
      a first interlayer dielectric layer disposed on and covering the substrate and the at least one isolation feature disposed in the substrate, such that the first interlayer dielectric layer directly contacts and covers a lower portion of the sidewalls of the first fin structure, a lower portion of the sidewalls of the second fin structure, a lower portion of the sidewalls of the first gate structure, and a lower portion of the sidewalls of the second gate structure; and
      a second interlayer dielectric layer disposed on and covering the first interlayer dielectric layer, such that the second interlayer dielectric layer directly contacts and covers an upper portion of the sidewalls of the first fin structure, an upper portion of the sidewalls of the second fin structure, an upper portion of the sidewalls of the first gate structure, and an upper portion of the sidewalls of the second gate structure, wherein a composition of the second interlayer dielectric layer is different than a composition of the first interlayer dielectric layer, and further wherein the composition of the first interlayer dielectric layer results from a first dielectric coating solution having a first viscosity and the composition of the second interlayer dielectric layer results from a second dielectric coating solution having a second viscosity, wherein the second viscosity is greater than the first viscosity.

2. The semiconductor device of claim 1, wherein a sum of a thickness of the first interlayer dielectric layer and a thickness of the second interlayer dielectric layer is greater than a height of the first fin structure and the second fin structure.

3. The semiconductor device of claim 1, wherein a thickness of the first interlayer dielectric layer is about 100 Å to about 800 Å, and a thickness of the second interlayer dielectric layer is about 100 Å to about 2,000 Å.

4. The semiconductor device of claim 1, wherein the first interlayer dielectric layer does not extend into the substrate.

5. The semiconductor device of claim 1, wherein a width of the interlayer dielectric structure is about 80 Å to about 190 Å.

6. The semiconductor device of claim 1, wherein a top surface of the first interlayer dielectric layer is lower than a top surface of a first work function layer of the first gate structure and a second work function layer of the second gate structure.

7. The semiconductor device of claim 1, wherein a constituent of the second dielectric coating solution is at least 10% greater than a constituent of the first dielectric coating solution.

8. The semiconductor device of claim 1, wherein the first viscosity is about 1 centipoise (cP) to about 1.5 cP and the second viscosity is about 1.8 cP to about 2 cP.

9. The semiconductor device of claim 1, wherein the interlayer dielectric structure has an aspect ratio of about 5 to about 16.

10. A semiconductor device comprising:
a plurality of fins disposed over a substrate;
a plurality of shallow trench isolation features disposed in the substrate;
a plurality of gate structures disposed over the substrate and the plurality of fins, such that the plurality of gate structures traverse the plurality of fins;
an interlayer dielectric structure disposed over the substrate, the plurality of shallow trench isolation features disposed in the substrate, the plurality of fins, and the plurality of gate structures, wherein the interlayer dielectric structure is disposed between sidewalls of the plurality of fins and sidewalls of the plurality of gate structures, and further wherein the interlayer dielectric structure includes:
a first anti-reflective coating (ARC) layer disposed on and covering the substrate and the plurality of shallow trench isolation features disposed therein, wherein the first ARC layer directly contacts and covers a portion of respective sidewalls of the plurality of fins and respective sidewalls of the plurality of gate structures, and further wherein the first ARC layer has a first thickness that is less than a height of the plurality of fins and a height of the plurality of gate structures; and
a second ARC layer disposed on and covering the first ARC layer, wherein the second ARC layer directly contacts and covers a portion of respective sidewalls of the plurality of fins and respective sidewalls of the plurality of gate structures, and further wherein the second ARC layer has a second thickness, such that a sum of the first thickness and the second thickness is greater than the height of the plurality of fins and about equal to the height of the plurality of gate structures, wherein a composition of the second ARC layer is different than a composition of the first ARC layer, and further wherein the first ARC layer has a composition resulting from a first solution having a first viscosity and the second ARC layer has a composition resulting from a second solution having a second viscosity, wherein the second viscosity is greater than the first viscosity.

11. The semiconductor device of claim 10, wherein a substantially planar top surface is defined by the substrate and the plurality of shallow trench isolation features, wherein the plurality of gate structures and the interlayer dielectric structure are disposed on the substantially planar top surface.

12. The semiconductor device of claim 10, wherein the first ARC layer and the second ARC layer have a refractive index of about 1 to about 2.2.

13. The semiconductor device of claim 10, wherein a width of the interlayer dielectric structure is less than about 150 Å.

14. The semiconductor device of claim 10, wherein the first thickness is less than the second thickness.

15. The semiconductor device of claim 10, wherein the first viscosity is about 1 centipoise (cP) to about 1.5 cP and the second viscosity is about 1.8 cP to about 2 cP.

16. A semiconductor device comprising:
a plurality of fins disposed over a substrate;
a plurality of isolation features disposed in the substrate;
a plurality of gate structures disposed over the substrate, the plurality of isolation features, and the plurality of fins, such that the plurality of gate structures traverse the plurality of fins, wherein each of the plurality of gate structures include gate spacers disposed along sidewalls of a metal gate; and
a void-free interlayer dielectric structure disposed over the substrate, the plurality of isolation features disposed in the substrate, the plurality of fins, and the plurality of gate structures, wherein the void-free interlayer dielectric structure is further disposed between sidewalls of the plurality of fins and sidewalls of the plurality of gate structures, wherein the void-free interlayer dielectric structure includes:
a contact etch stop layer disposed over the substrate, wherein the contact etch stop layer is disposed along sidewalls of the gate spacers,
a first interlayer dielectric layer disposed on and directly contacting the contact etch stop layer, wherein the first interlayer dielectric layer has a first thickness that is less than a height of the plurality of fins and a height of the plurality of gate structures, such that the first interlayer dielectric layer has a top surface that is lower than a top surface of the plurality of gate structures, and
a second interlayer dielectric layer disposed on and directly contacting the first interlayer dielectric layer and the contact etch stop layer, wherein the second interlayer dielectric layer has a second thickness, such that the second interlayer dielectric layer has a top surface that is substantially planar with the top surface of the plurality of gate structures and a sum of the first thickness and the second thickness is greater than the height of the plurality of fins and about equal to the height of the plurality of gate structures, and further wherein the first interlayer dielectric layer and the second interlayer dielectric layer each directly contact and cover respective portions of the contact etch stop layer disposed along the sidewalls of the gate spacers, and further wherein a composition of the second interlayer dielectric layer is different than a composition of the first interlayer dielectric layer, and further wherein the composition of the first interlayer dielectric layer results from a first dielectric coating solution having a first viscosity and the composition of the second interlayer dielectric layer results from a second dielectric coating solution having a second viscosity, wherein the second viscosity is greater than the first viscosity.

17. The semiconductor device of claim 16, wherein the first interlayer dielectric layer and the second interlayer dielectric layer include an organic dielectric material, wherein the organic dielectric material of the first interlayer dielectric layer is formed from a first solution and the organic dielectric material of the second interlayer dielectric layer is formed from a second solution that is different than the first solution.

18. The semiconductor device of claim 16, wherein the first interlayer dielectric layer and the second interlayer dielectric layer include an inorganic dielectric material, wherein the inorganic dielectric material of the first interlayer dielectric layer is formed from a first solution and the inorganic dielectric material of the second interlayer dielectric layer is formed from a second solution that is different than the first solution.

19. The semiconductor device of claim 16, wherein the first thickness is about 100 Å to about 800 Å and the second thickness is about 100 Å to about 2,000 Å.

20. The semiconductor device of claim 16, wherein the metal gate includes a high-k dielectric layer disposed over the substrate and a metal gate layer disposed over the high-k dielectric layer.

\* \* \* \* \*